(12) United States Patent  (10) Patent No.: US 7,659,619 B1
Zingher et al.  (45) Date of Patent: Feb. 9, 2010

(54) STRUCTURES FOR Z-ALIGNED PROXIMITY COMMUNICATION

(75) Inventors: Arthur R. Zingher, Mountain View, CA (US); Robert J. Moffat, Los Altos, CA (US); Ronald Ho, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 485 days.

(21) Appl. No.: 11/249,821

(22) Filed: Oct. 12, 2005

Related U.S. Application Data

(60) Provisional application No. 60/618,646, filed on Oct. 13, 2004.

(51) Int. Cl.
*H01L 29/41* (2006.01)
(52) U.S. Cl. ............... 257/735; 257/736; 257/E23.078
(58) Field of Classification Search ............ 257/E23.01, 257/E25.011, 459, E23.015, E23.039, 735, 257/736, E23.078
See application file for complete search history.

(56) References Cited

U.S. PATENT DOCUMENTS

| | | | | |
|---|---|---|---|---|
| 5,917,707 A | * | 6/1999 | Khandros et al. | 361/776 |
| 6,181,287 B1 | * | 1/2001 | Beigel | 343/741 |
| 6,998,703 B2 | * | 2/2006 | Di Stefano | 257/686 |
| 2001/0002624 A1 | * | 6/2001 | Khandros et al. | 174/250 |
| 2004/0238851 A1 | * | 12/2004 | Flores et al. | 257/202 |
| 2005/0205985 A1 | * | 9/2005 | Smith et al. | 257/688 |

* cited by examiner

*Primary Examiner*—Allan R. Wilson
(74) *Attorney, Agent, or Firm*—Park, Vaughan & Fleming LLP

(57) ABSTRACT

A device includes a first semiconductor die having a first surface and a second surface. The first semiconductor die is configured to communicate by capacitive coupling using one or more of a plurality of proximity connectors proximate to the first surface. The first semiconductor die is configured to have a flexibility compliance greater than a first pre-determined value in a direction substantially perpendicular to a plane including the plurality of proximity connectors in order to reduce misalignment in the direction between the plurality of proximity connectors and additional proximity connectors on another device.

22 Claims, 12 Drawing Sheets

STRUCTURES FOR Z-ALIGNED PROXIMITY COMMUNICATION

CROSS REFERENCE TO RELATED APPLICATIONS

This application claims priority under 35 U.S.C. 119(e) to U.S. Provisional Application Ser. No. 60/618,646, filed on Oct. 13, 2004, the contents of which are herein incorporated by reference.

GOVERNMENT LICENSE RIGHTS

This invention was made with United States Government support under Contract No. NBCH3039002 awarded by the Defense Advanced Research Projects Administration. The United States Government has certain rights in the invention.

BACKGROUND

1. Field of the Invention

The present invention relates to connector alignment for semiconductor dies. More specifically, the present invention relates to structures having flexibility compliance to facilitate communication of signals between semiconductor dies using proximity connectors.

2. Related Art

Researchers have begun to investigate alternative techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, it becomes possible to transmit data signals directly from the first chip to the second chip without having to route the data signals through intervening signal lines within a printed circuit board.

Capacitive coupling depends on a relative position of the transmitter pads and the receiver pads, both in a plane defined by the pads and in a direction perpendicular to the plane. Misalignment in the plane may cause each receiving pad to span two transmitting pads, thereby destroying a received signal. In theory, satisfactory communication requires alignment such that misalignment is less than half of a pitch between the pads. In practice, the alignment requirements may be more stringent. In addition, limiting overall misalignment may improve communication performance between the chips and reduce power consumption.

Unfortunately, it is not a simple matter to align the chips properly using existing mounting structures, such as conventional single-chip modules or conventional multi-chip modules. The chips in these structures are subject to thermal expansion and mechanical vibrations, as well as manufacturing and assembly perturbations that result in misalignment problems. In addition, existing approaches to compensate for or reduce misalignment in the plane of the pads may be less effective when there is significant misalignment in the direction perpendicular to the plane.

What are needed are single-chip modules and multi-chip modules that include one or more structures having flexibility compliance in the direction perpendicular to the plane to reduce misalignment in this direction and thereby facilitate capacitive inter-chip communication without the problems listed above.

SUMMARY

Embodiments of a device are described. The device includes a first semiconductor die having a first surface and a second surface. The first semiconductor die is configured to communicate by capacitive coupling using one or more of a plurality of proximity connectors proximate to the first surface. The first semiconductor die is configured to have a flexibility compliance greater than a first pre-determined value in a direction substantially perpendicular to a plane including the plurality of proximity connectors in order to reduce misalignment in the direction between the plurality of proximity connectors and additional proximity connectors on another device.

The first semiconductor die may have a thickness approximately less than a second pre-determined value.

The misalignment may be less than one half of a first pitch of at least a subset of connectors in the plurality of proximity connectors.

In some embodiments, the flexibility compliance is provided by a flexural unit. The flexural unit may include the plurality of proximity connectors and interconnect wires positioned above the first surface. The plurality of proximity connectors and at least a portion of the interconnect wires may be configured to displace substantially in the direction with respect to the first surface.

The flexural unit may include a plurality of flaps having a first end and second end. Each flap may be coupled to the semiconductor die at the first end, and may include one or more connectors in the plurality of proximity connectors.

The flexural unit may include an electro-mechanical transducer coupled to the first surface of the semiconductor die and at least the portion of the interconnect wires. The electro-mechanical transducer may be configured to displace the plurality of proximity connectors and at least the portion of the interconnect wires.

Embodiments of a system are also described. The system includes the first semiconductor die having the first surface and the second surface, and a component having a third surface and a fourth surface. The first semiconductor die is configured to communicate by capacitive coupling using one or more of a first plurality of proximity connectors proximate to the first surface. The component is configured to communicate by capacitive coupling with one or more of the first plurality of proximity connectors using one or more of a second plurality of proximity connectors proximate to the third surface. The component is configured to have a flexibility compliance greater than the first pre-determined value in a first direction substantially perpendicular to a plane including the second plurality of proximity connectors in order to reduce misalignment in the first direction between the first plurality of proximity connectors and the second plurality of proximity connectors.

The system may include a spacer positioned between the first surface of the first semiconductor die and the third surface of the component.

The component may be a second semiconductor die. The component may have a thickness approximately less than the second pre-determined value.

The misalignment may be less than one half of the first pitch of at least a subset of connectors in the first plurality of proximity connectors.

In some embodiments, the flexibility compliance is provided by a flexural unit. The flexural unit may include the second plurality of proximity connectors and interconnect wires positioned above the third surface. The second plurality of proximity connectors and at least a portion of the interconnect wires may be configured to displace substantially in the first direction.

The flexural unit may include the plurality of flaps each having the first end and second end. Each flap may be coupled to the component at the first end, and may include one or more connectors in the second plurality of proximity connectors.

The flexural unit may include an electro-mechanical transducer coupled to the third surface of the semiconductor die and to at least the portion of the interconnect wires. The electro-mechanical transducer may be configured to displace the second plurality of proximity connectors and at least the portion of the interconnect wires.

In some embodiments, the system further includes a control circuit. The control circuit provides feedback to reduce misalignment in the first direction between the first plurality of proximity connectors and the second plurality of proximity connectors.

In some embodiments, the first semiconductor die is configured to have a flexibility compliance greater than a third pre-determined value in the first direction in order to reduce misalignment in the first direction between the first plurality of proximity connectors and the second plurality of proximity connectors.

In some embodiments, the system further includes a second semiconductor die having a fifth surface and a sixth surface. The second semiconductor die is configured to communicate by capacitive coupling using one or more of a third plurality of proximity connectors proximate to the fifth surface. The component is further configured to communicate by capacitive coupling with one or more of the third plurality of proximity connectors using one or more of a fourth plurality of proximity connectors proximate to the third surface. The component is configured to have a flexibility compliance greater than the first pre-determined value in a second direction substantially perpendicular to a plane including the fourth plurality of proximity connectors in order to reduce misalignment in the second direction between the third plurality of proximity connectors and the fourth plurality of proximity connectors. The component further includes interconnect wires to couple respective connectors in the second plurality of proximity connectors to respective connectors in the fourth plurality of proximity connectors.

BRIEF DESCRIPTION OF THE FIGURES

Like reference numerals refer to corresponding parts throughout the drawings.

DETAILED DESCRIPTION

Figure 1A:
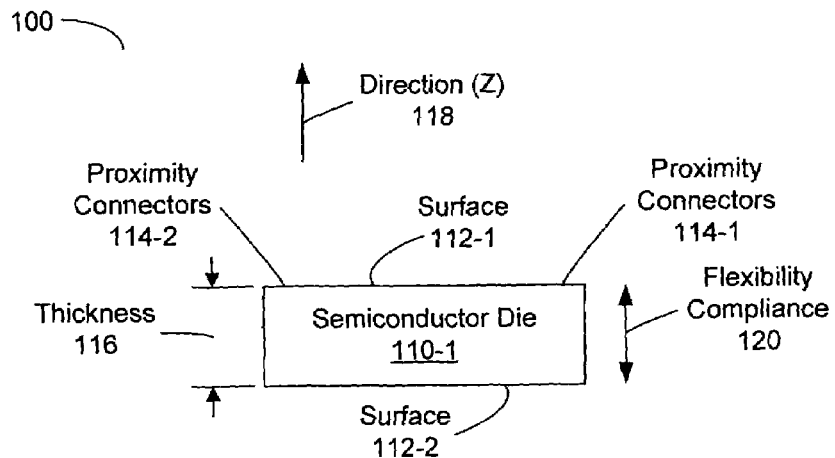
FIG. 1A is a block diagram illustrating a side view of an embodiment of a single-chip module.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a semiconductor die, single-chip module (SCM) and multi-chip modules (MCM) are disclosed. The semiconductor die includes integrated circuit electronics corresponding to layers deposited on a semiconductor substrate. When packaged, for example in the SCM, one or more semiconductor dies are sometimes referred to as a chip. The MCM may include two or more SCMs. The semiconductor die, the SCM and/or the MCM include solutions to packaging challenges such as at least some of the misalignment problems associated with proximity communication using a plurality of proximity pads or connectors. The proximity connectors may be on or proximate to at least one surface of the semiconductor die, the SCM and/or the MCM. In other embodiments, the semiconductor die, the SCM and/or the MCM may be coupled to the proximity connectors. In exemplary embodiments, the plurality of proximity connectors are substantially located at one or more corners and/or edges of a respective semiconductor die.

In order to communicate data signals using proximity communication, transmit and receive proximity connectors on adjacent semiconductor dies may have, at worst, only limited misalignment, i.e., substantially accurate alignment. For densely packed proximity connectors, i.e., connectors having a small spacing or pitch between adjacent pads, such alignment between two or more proximity connectors on adjacent semiconductor dies may be within a few microns in a first direction (X) and/or a few microns in a second direction (Y) in a first plane including at least some of the proximity connectors, and/or within a few microns in a third direction (Z) approximately perpendicular to the first plane. In some embodiments, the proximity connectors may be aligned in six degrees of freedom, including the first direction (X), the second direction (Y), the third direction (Z), an angle in the first plane defined by the first direction (X) and the second direction (Y), an angle in a second plane defined by the first direction (X) and the third direction (Z), and an angle in a third plane defined by the second direction (Y) and the third direction (Z). Note that if a surface of either of the adjacent semiconductor dies is non-planar (for example, due to quadrapole distortion), additional alignment problems are introduced.

In some embodiments, allowed misalignment in the first direction (X), the second direction (Y) and/or the third direction (Z) is less than one half of the pitch between adjacent pads. For example, misalignment in the first direction (X) and/or the second direction (Y) may be less than 25 µm, and misalignment in the third direction (Z) may be less than 5 µm.

The solutions described below reduce and/or eliminate misalignment in the third direction (Z). Reducing or eliminating such misalignment, in turn, may increase a magnitude of the data signals. In addition, the solutions may reduce misalignment in the first plane, i.e., the plane including at least some of the proximity connectors, when used in conjunction with techniques such as electronic steering (where data signals are routed to respective proximity connectors in accordance with the alignment in the first plane). As a consequence, these solutions may facilitate proximity communication between the semiconductor dies, SCMs and/or MCMs.

In some embodiments, the solutions include self-alignment and/or self-adjustment of relative positions of the proximity connectors on adjacent semiconductor dies in the third direction (Z). In other embodiments, a feedback control loop may be used to reduce and/or eliminate the misalignment in the third direction (Z). In particular, in the embodiments described below alignment in the third direction (Z) is improved through the use of structures that are flexibility compliant (spring like). The structures may be implemented in a respective semiconductor die, on two or more semiconductor dies, and/or in a component coupling two or more semiconductor dies.

The structures may be implemented by a selective removal or addition of material to the respective semiconductor die to allow flexibility compliance of at least a portion of the respective semiconductor die. These structures may reduce or eliminate a need for narrow tolerances and precise manufacturing of the semiconductor die, the SCM and/or the MCM. In addition, precise assembly may not be needed. Moderate forces between semiconductor dies, SCMs and/or MCMs and small movements of the semiconductor dies, the SCMs and/ or the MCMs may counteract thermal distortions, mechanical vibrations, external forces, fabrication tolerances and assembly perturbations that result in misalignment problems.

The proximity connectors may utilize capacitive coupling, which may increase a bandwidth and/or a number of data signal channels for inter-chip communication. By reducing the aforementioned misalignment, capacitive coupling in these embodiments is enabled by increasing data signals and/ or overlapping one or more proximity connectors on adjacent semiconductor dies. In other embodiments, other and/or additional connectors may be overlapped on adjacent semiconductor dies. One embodiment uses magnetic proximity connectors, where data signals are communicated magnetically between terminals on closely adjacent semiconductor dies. Another embodiment uses optical proximity connectors, where data signals are communicated optically between terminals on adjacent semiconductor dies. Another embodiment may couple connectors in adjacent semiconductor dies using an array of tiny solder balls.

The semiconductor die, the SCM and/or the MCM may adapt materials, processes and tools that are known in the art in order to improve feasibility, i.e., to reduce expenses associated with manufacturing and assembly of the semiconductor die, the SCM and/or the MCM.

Attention is now directed towards embodiments of structures for Z-aligned (i.e., in the third direction (Z)) proximity communication. FIG. 1A is a block diagram illustrating a side view of an embodiment of a single-chip module (SCM) 100. The SCM 100 includes a semiconductor die 110-1. The semiconductor die 110-1 has a first surface 112-1 and a second surface 112-2. The semiconductor die 110-1 has proximity connectors 114 located on or proximate to the first surface 112-1. For example, the plurality of proximity connectors 114 may be situated beneath a protective layer such that they are located below the first surface 112-1. The semiconductor die 110-1 may also include wiring and electronics (not shown) to relay the data signals to additional electronics on the semiconductor die 110-1 such as logic and/or a cache.

Figure 1B:
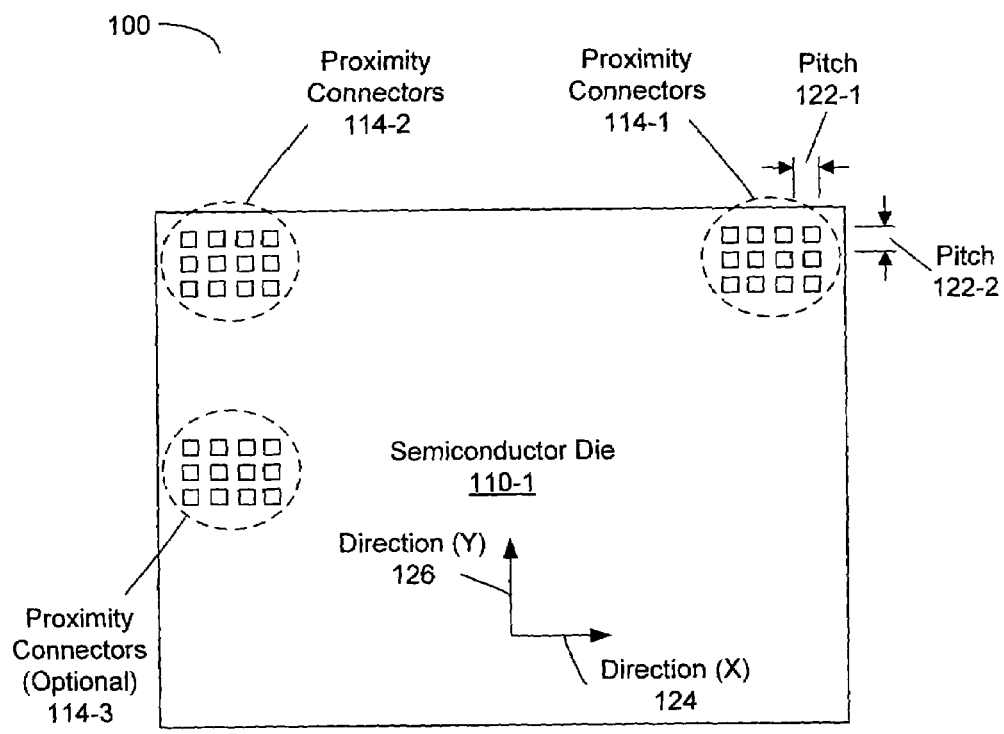
FIG. 1B is a block diagram illustrating a top view of an embodiment of a single-chip module.

FIG. 1B is a block diagram illustrating a top view of an embodiment of the SCM 100. Proximity connectors 114-1 and 114-2 are situated in regions (henceforth referred to as communication regions) near corners of the semiconductor die 110-1. In addition, there may be optional proximity connectors 114-3 situated in a communication region near a side of the semiconductor die 110-1. In other embodiments, proximity connectors may be situated at one or more arbitrary locations on or proximate to the first surface 112-1 (FIG. 1A). As illustrated for the proximity connectors 114-1, there is a first pitch 122-1 between adjacent connectors or pads in a first direction (X) 124 of the surface 112-1 (FIG. 1A) and a second pitch 122-2 between adjacent connectors or pads in a second direction (Y) 126 of the surface 112-1 (FIG. 1A). In some embodiments, the first pitch 122-1 and the second pitch 122-2 are approximately equal.

Referring back to FIG. 1A, as discussed previously various mechanical and electrical techniques have been devised for minimizing or compensating for misalignments in the first plane, assuming that the communicating regions are well aligned in a third direction (Z) 118. Some of those techniques, however, become unreliable if there is significant misalignment in the third direction (Z) 118.

The SCM 100 illustrates an approach to addressing misalignment in the third direction (Z) 118. Since a stiffness of the semiconductor die 110-1 scales as a cubic function of a thickness 116, the semiconductor die 110-1 may be selected or fabricated such that the semiconductor die 110-1 has a flexibility compliance 120 in the third direction (Z) 118 greater than a pre-determined value. (For a given geometry, including the thickness 116, the flexibility compliance 120 may be determined using a Young's modulus of the semiconductor die 110-1.) The flexibility compliance 120 allows the semiconductor die 110-1 to deform elastically.

The flexibility compliance 120 may allow at least a subset of the proximity connectors 114 to displace along the third direction (Z) 118 (relative to a centroid of the semiconductor die 110-1) when pressed against another semiconductor die and/or component (with a controlled force) thereby reducing or eliminating misalignment in the third direction (Z) 118. In some embodiment, one or more portions of the semiconductor die 110-1 may have the thickness 116 and/or a length such that the semiconductor die 110-1 may bend allowing a relative displacement of the proximity connectors 114-1 and 114-2 along the third direction (Z) 118. This is illustrated further below with reference to FIG. 6. In some embodiments, the semiconductor die 110-1 may be relatively stiff in the communication regions.

In an exemplary embodiment, the semiconductor die 110-1 may include a silicon substrate or wafer and the thickness 116 may be less than 30 μm (as opposed a current thickness of some 600 μm). Other suitable materials for the substrate include another semiconductor material, covalent crystal wafers and/or glass. In another exemplary embodiment, the thickness 116 may be less than 20 μm.

Silicon at these thicknesses offers excellent elastic properties over a broad range of stress values. It can bend and recover many times without yielding to plastic deformation. In one exemplary embodiment, electronic devices, wiring and terminals may be fabricated on a wafer having a standard thickness. The wafer may be subsequently thinned (using techniques such as wet chemical etching, reactive ion etching, laser processing and/or chemical mechanical polishing, which are known in the art) without damaging the electronic devices, wiring or terminals. In another exemplary embodiment, a blank wafer may be thinned. The thinned wafer may be temporarily adhered to a back-wafer. Electronic devices, wiring and terminals are fabricated upon this layered wafer. The back-wafer may be removed without damaging the thinned wafer, the electronic devices, the wiring or the terminals.

Figure 1C:
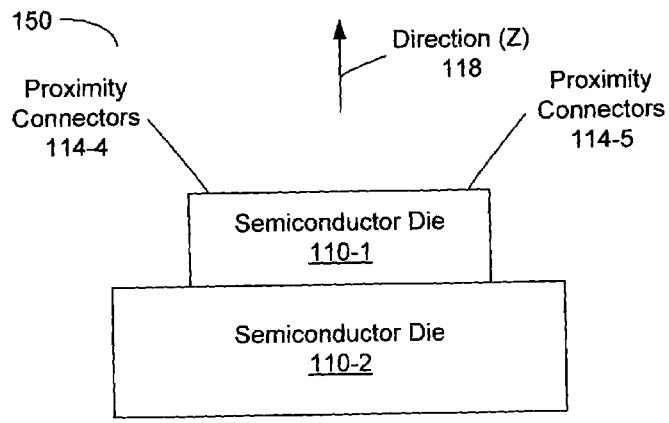
FIG. 1C is a block diagram illustrating a side view of an embodiment of a multi-chip module.

FIG. 1C is a block diagram illustrating a side view of an embodiment of a multi-chip module (MCM) 150. The semiconductor die 110-1 is electrically and/or thermally coupled to a surface of a semiconductor die 110-2 via a coupling layer. The coupling layer has an average thickness (not shown). In embodiments such as the MCM 150, the semiconductor die 110-2 is sometimes referred to as the carrier and the semiconductor die 110-1 is sometimes referred to as the payload. At least a portion of the semiconductor die 110-1 and/or the semiconductor die 110-2 may have a thickness such that the MCM 150 has a flexibility compliance in the third direction (Z) 118 that is greater than the pre-determined value.

It should be understood that the SCM 100 and the MCM 150 are illustrative of the components and functionality of a SCM and a MCM, respectively. In additional embodiments, the SCM 100 and/or the MCM 150 may include fewer or additional components. For example, there may be one or more additional payload semiconductor dies in the MCM 150. These additional payload semiconductor dies may be laminarly stacked on top of one another. In addition, two or more components may be combined into a single component. In some embodiments, the semiconductor die 110-2 may also include proximity connectors.

Figure 2:
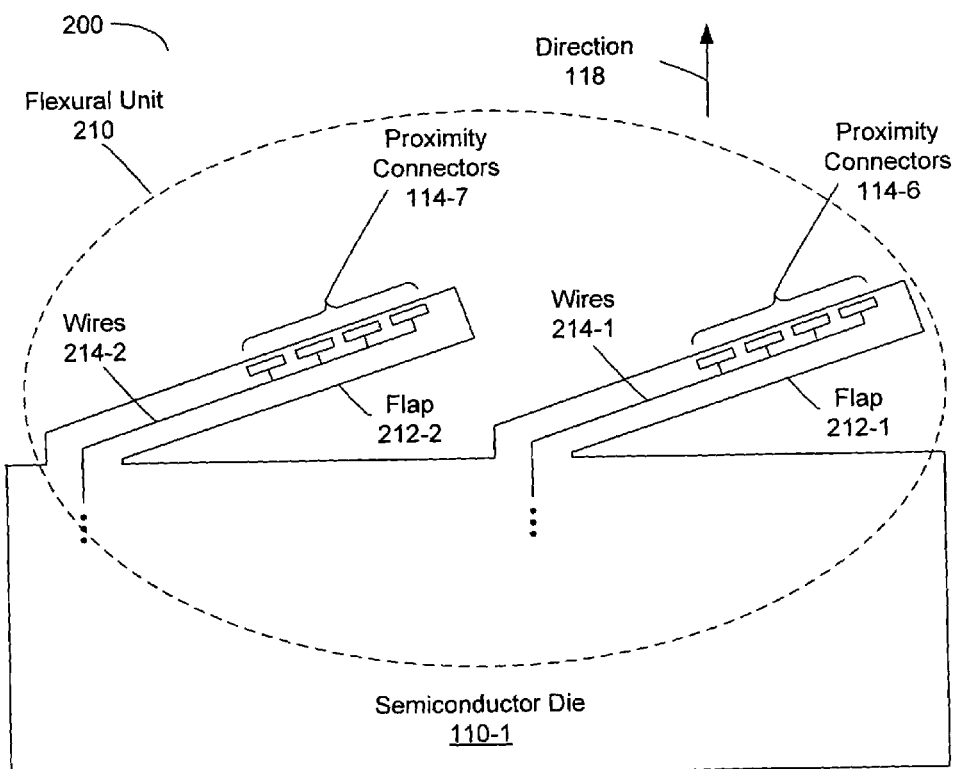
FIG. 2 is a block diagram illustrating a side view of an embodiment of a semiconductor die having a flexural unit.

FIG. 2 is a block diagram illustrating a side view of an embodiment 200 of the semiconductor die 110-1 having a flexural unit 210. The flexural unit 210 may include one or more flaps 212. The flaps 212 are intentionally non-adherent to a portion of a surface of the semiconductor die 110-1. This may be accomplished using micro electro-mechanical system (MEMS) techniques that are known in the art to remove material beneath the flaps 212 (for example, using a sacrificial layer). The flaps 212, including wires 214 and proximity connectors 114 (each including one or more pads or connectors), have a flexibility compliance greater than the pre-determined value in the third direction (Z) 118. This flexibility allows the flaps 212 to displace approximately along the third direction (Z) 118 and relative to a centroid of the semiconductor die 110-1.

The flaps 212 may have a variety of cross-sectional shapes including rectangular and square. When viewed from above (such as the top view shown in FIG. 1B), the flaps 212 may have rectangular, square and/or triangular shape. The flaps 212 may be bent away from the surface 112-1 (FIG. 1A) of the semiconductor die 110-1 or may bend away from the surface 112-1 (FIG. 1A) of the semiconductor die 110-1 due to residual stress. The flaps 212 may include one or more wires 214 and/or one or more layers. The wires 214 may include at least one layer with a relatively large elastic/plastic limit. For example, a dielectric layer having a thickness in the micron range, which is deposited on silicon dioxide or another amorphous insulator, has a relatively high elastic/plastic limit. Therefore, the flaps 212 may deflect elastically over a sufficiently large range of stresses. In some embodiments, the wires 214 may substantially form a body of the flaps 212.

In some embodiments, some respective connectors in the proximity connectors 114 on the flaps 212 may be coupled to transmitters and other respective connectors in the proximity connectors 114 on the flaps 212 may be coupled to receivers. A respective transmitter or receiver may be coupled to individual pads or to groups of pads in a respective proximity of connectors, such as proximity connectors 114-6.

Removal of material beneath the flaps 212 gives rise to an air gap between the flaps 212 and the semiconductor die 110-1. This gap may improve a signal-to-noise ratio of data signals during proximity communication. In embodiments without the flaps 212 and the air gap, the structures in a top layer of metal on the semiconductor die 110-1 have stray or parasitic capacitance with lower layers of metal. Field lines between these metal layers may cross through one or more intervening silicon dioxide layers. Silicon dioxide has a relative dielectric constant approximately equal to four. In contrast, the air gap has a relative dielectric constant of one. The silicon dioxide, therefore, acts to increase the parasitic capacitance of the wires 214. The air gap, in turn, acts to reduce the parasitic capacitance of the wires 214.

The flaps 212, however, increase a separation between the proximity connectors 114 and underlying or additional circuitry on the semiconductor die 110-1, since the wires 214 run through hinges of the flaps 212. On balance, this additional routing length may increase an overall parasitic capacitance. The additional capacitance associated with the flaps 212 may therefore increase an overall latency (relative to embodiments without flaps 212) for transmitters. For receivers, however, the additional capacitance associated with the flaps 212 may significantly degrade the signal-to-noise ratio (relative to embodiments without flaps 212). As a consequence, in some embodiments respective connectors in the proximity connectors 114 in one or more of the flaps 212 are only coupled to transmitters.

In some embodiments, the parasitic capacitance may be reduced and the flexibility compliance may be increased by at least partially filling the air gap with a compressible non-electrically-conductive material that has a low relative dielectric constant. If the material is also thermally conductive, it may facilitate cooling of the proximity connectors 114. Most of the power, however, is consumed by the wiring 214 and circuits outside of the flexural unit 210.

It should be understood that embodiment 200 is illustrative of the components and functionality of the semiconductor die 110-1. In additional embodiments, the semiconductor die 110-1 may include fewer or additional components, relative positions of two or more components may be changed, and two or more components may be combined into a single component. For example, there may be additional flaps 212 or there may only be one flap (such as flap 212-1). As discussed above, a single flap may lead to routing bottlenecks at the hinge of the flap 212-1. The design challenge may be compounded in embodiments that include proximity connectors 114 that are coupled to transmitters and to receivers. Embodiments where the proximity connectors 114 on each flap 212 are coupled to a single transmitter (or receiver) may reduce this bottleneck (i.e., allow easier routing) and improve an overall planar conformity between adjacent semiconductor dies (i.e., reduce the misalignment in the third direction (Z) 118) at the cost of increased processing complexity.

Figure 3A:
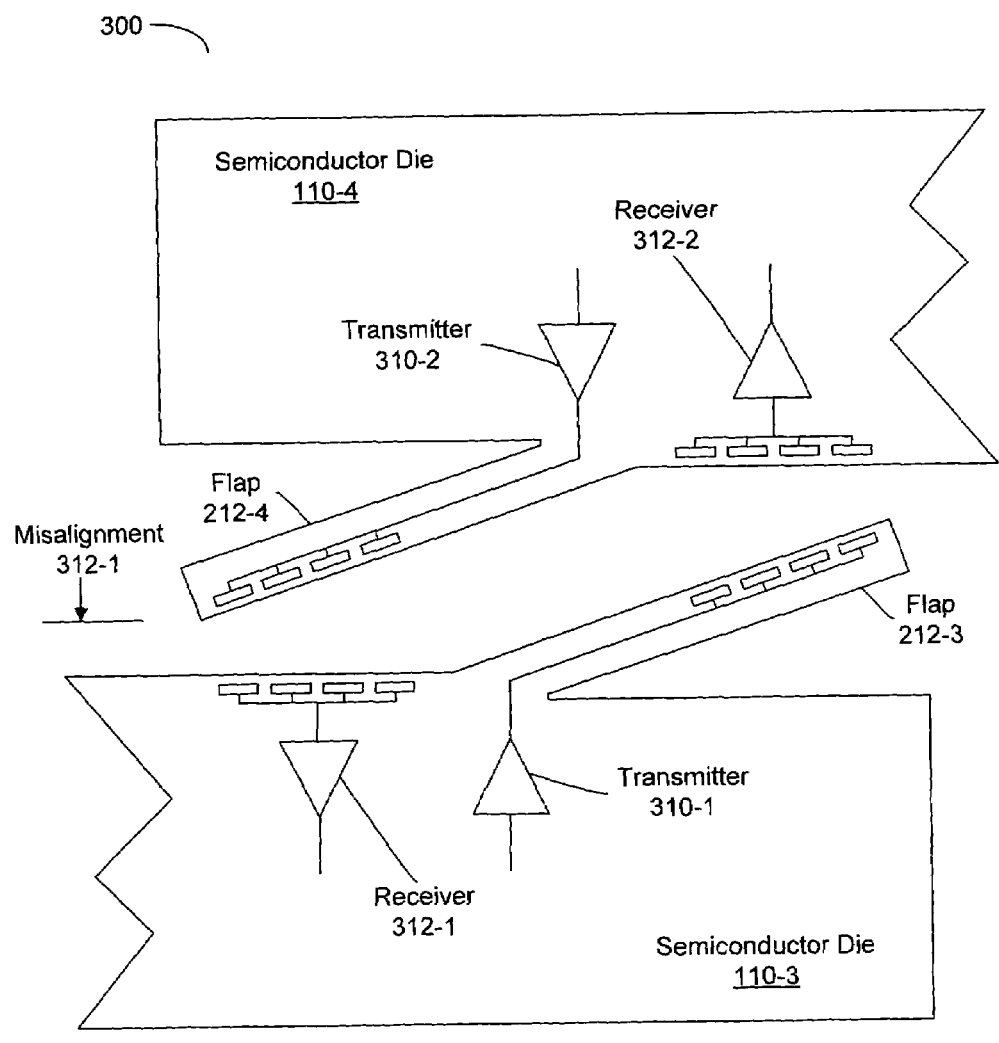
FIG. 3A is a block diagram illustrating a side view of an embodiment of a system including semiconductor dies having flexural units.
Figure 3B:
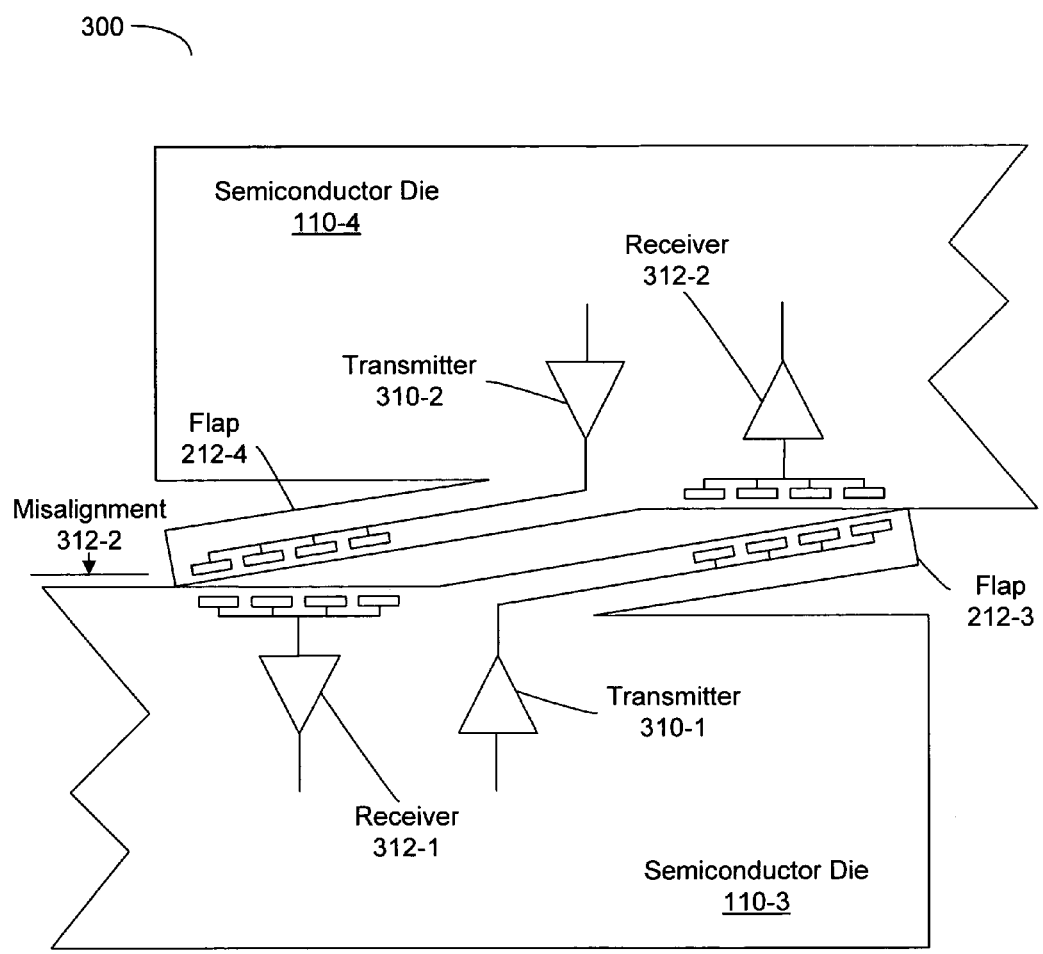
FIG. 3B is a block diagram illustrating a side view of an embodiment of a system including semiconductor dies having flexural units.

FIG. 3A and 3B are block diagrams illustrating a side view of an embodiment of a system 300 including semiconductor dies 110 having flexural units 212. In the system 300, proximity connectors on each of the flaps 212 are coupled to transmitters 310. Receivers 312 are coupled to proximity connectors that are proximate to surfaces of the semiconductor dies 110, i.e., proximity connectors that are not on the flaps 212. In other embodiments, the receivers 212 are coupled to proximity connectors on one or more flaps 212. For example, if proximity connectors on the flaps 212 are coupled to both transmitters 310 and receivers 312, the flaps 212 may only be machined or fabricated on one of the semiconductor dies, such as semiconductor die 110-3. This may reduce an overall cost of the system 300. In order to overcome the added parasitic capacitance (see the discussion above), the receivers 312 in such embodiments may be more sensitive than those in the system 300.

As shown in FIG. 3B, as the semiconductor dies are pushed together (by a controlled force), a minimum misalignment 312-1 (in FIG. 3A) in the third direction (Z) 118 (FIGS. 1A and 2) is reduced to a minimum misalignment 312-2. Note that while there are high-capacitive, compliant materials that could be used as a gasket between the adjacent semiconductor dies 110 to reduce the sensitivity to misalignment in the third direction (Z) 118 (FIGS. 1A and 2), these materials may degrade the data signals (and thus the signal-to-noise ratio) as well as increase the cost and complexity of the system 300.

It should be understood that system 300 is illustrative of the components and functionality of the semiconductor dies 110. In additional embodiments, one or more of the semiconductor dies 110 may include fewer or additional components, relative positions of two or more components may be changed, and two or more components may be combined into a single component.

Figure 4:
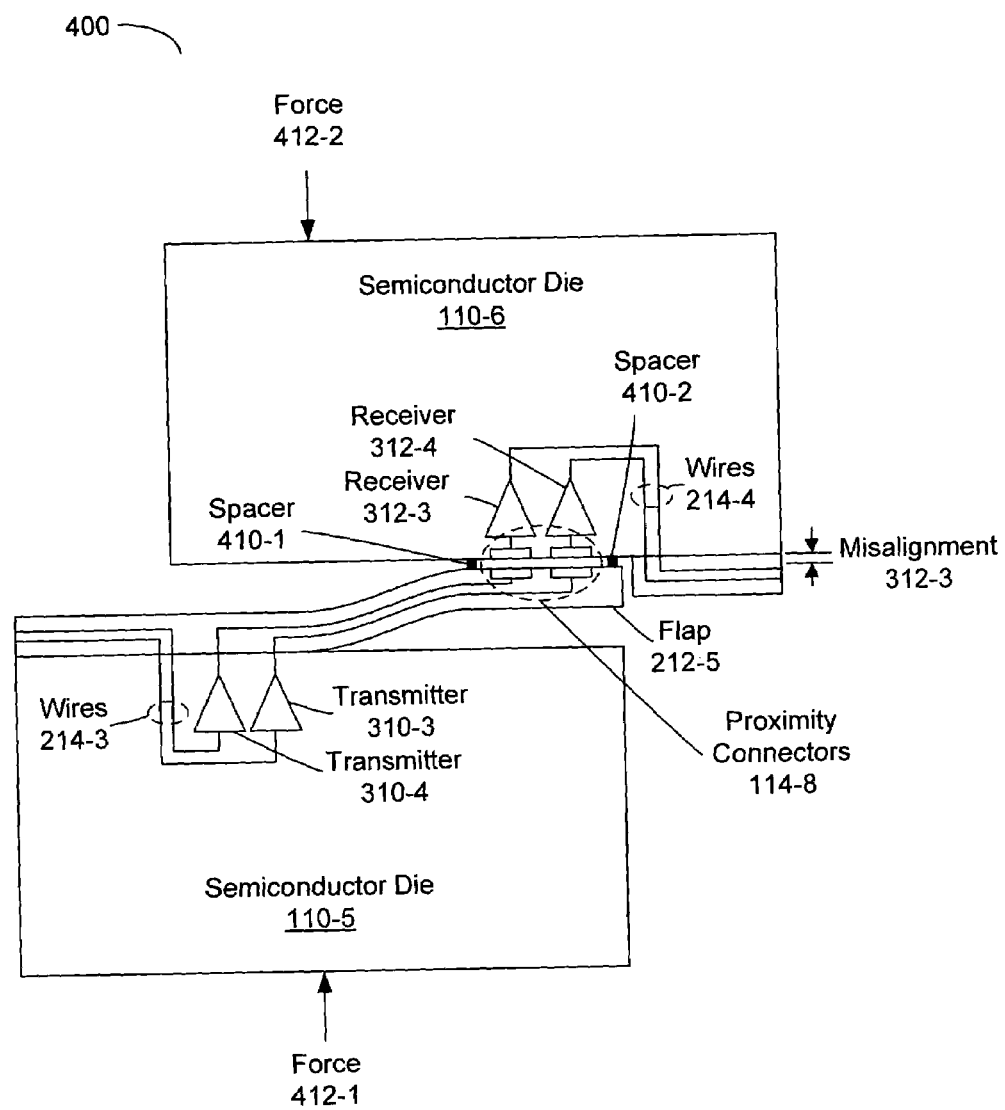
FIG. 4 is a block diagram illustrating a side view of an embodiment of a system including a semiconductor die having a flexural unit.

FIG. 4 is a block diagram illustrating a side view of an embodiment of a system 400 including a semiconductor die 110-5 having a flexural unit. In the system 400, two transmitters 310 are coupled to proximity connectors on flap 212-5. Proximity connectors on the flap 212-5 are capacitively coupled to proximity connectors on semiconductor die 110-6 forming coupled proximity connectors 114-8. Forces 412 on the semiconductor dies 110 result in a displacement of the flap 212-5 thereby reducing misalignment 312-3. Note the use of spacers 410 in the system 400. These may ensure a minimum (controlled) misalignment 312-3. A finite (i.e., non-zero) misalignment in this embodiment, as well as the other disclosed embodiments, may be beneficial for proximity communication.

It should be understood that system 400 is illustrative of the components and functionality of the semiconductor dies 110. In additional embodiments, one or more of the semiconductor dies 110 may include fewer or additional components, relative positions of two or more components may be changed, and two or more components may be combined into a single component.

Figure 5:
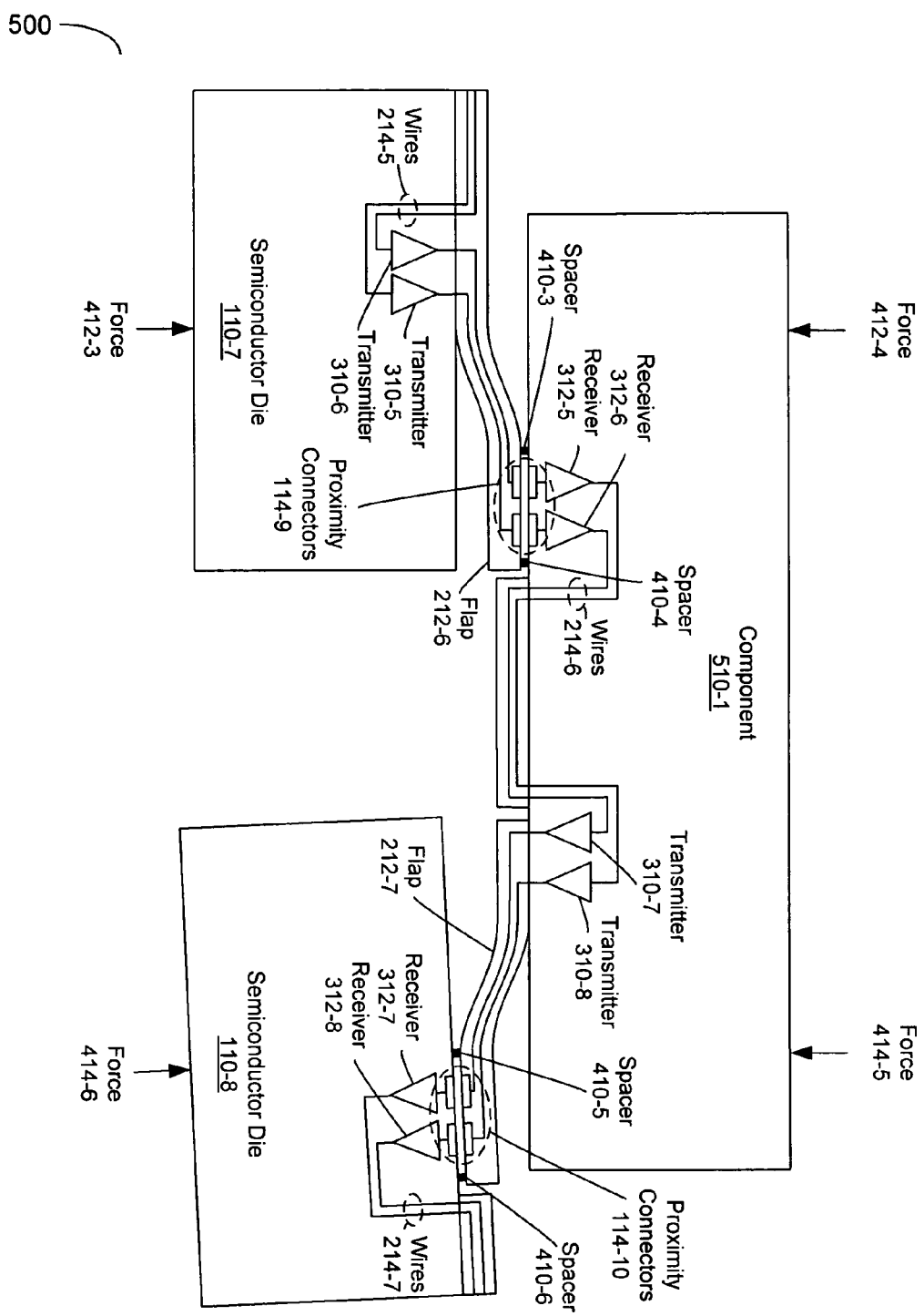
FIG. 5 is a block diagram illustrating a side view of an embodiment of a system including a component and semiconductor dies having flexural units.

FIG. 5 is a block diagram illustrating a side view of an embodiment of a system 500 including a component 510-1 and semiconductor dies 110 having flexural units. The component 510-1 may be a semiconductor die. The component bridges the semiconductor dies 110 by coupling proximity connectors 114-9 and 114-10. The proximity connectors located on or proximate to a surface of the component 510-1 are coupled by wires 214-6. The wires 214-6 may add additional capacitance to ground to one or more communication paths. Moderate extra capacitance at the transmitters 310 may be compensated for by using transmitters 310 having lower impedance. The flaps 212 in the system 500 allow for reduction or elimination of misalignment, such as the misalignment 312-3 (FIG. 4), as well planar misalignment of semiconductor dies 110-7 and 110-8. In some embodiments, flaps 212-6 and 212-7 may have different flexibility compliances.

It should be understood that system 500 is illustrative of the components and functionality of the semiconductor dies 110. In additional embodiments, one or more of the semiconductor dies 110 may include fewer or additional components, relative positions of two or more components may be changed, and two or more components may be combined into a single component.

Figure 6:
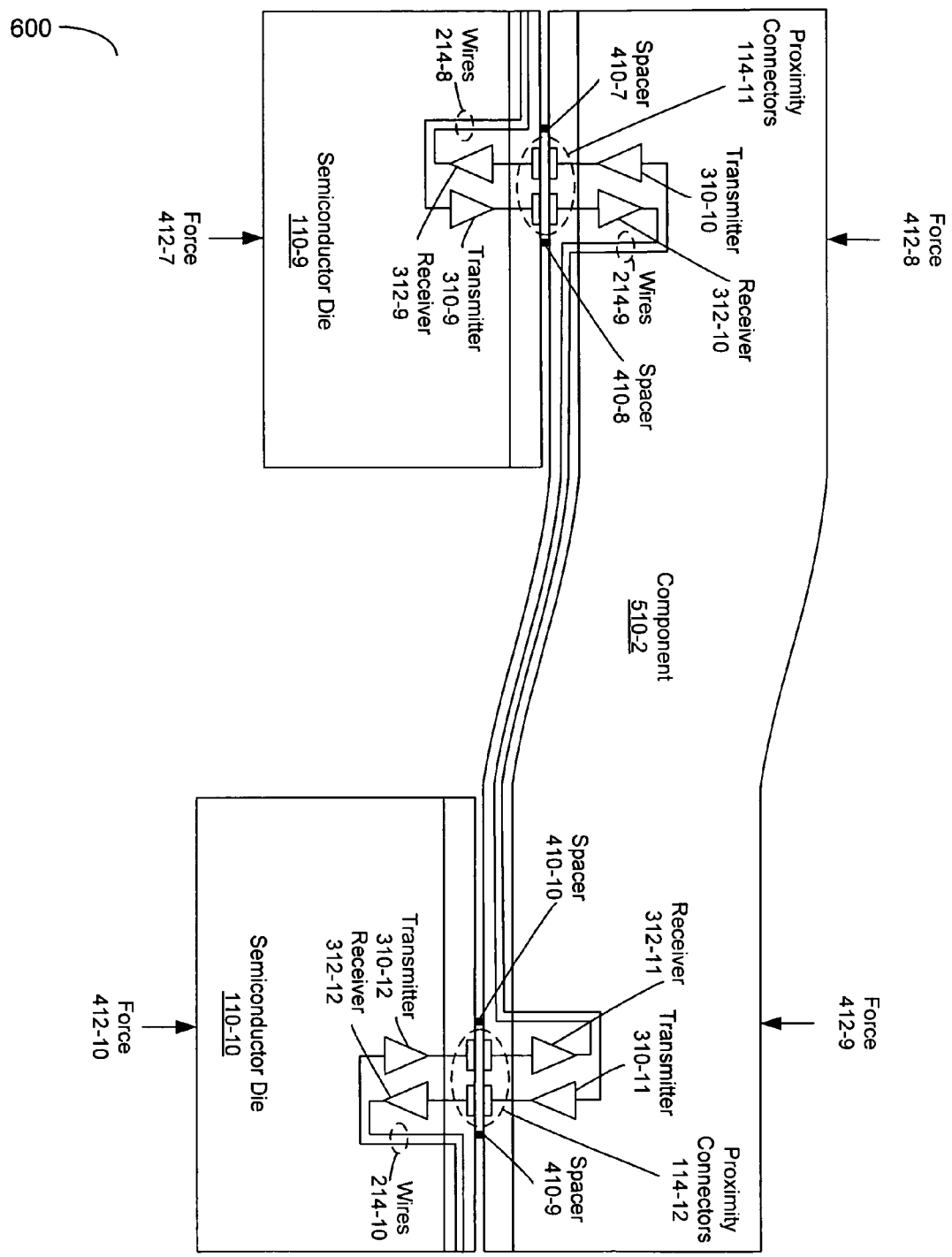
FIG. 6 is a block diagram illustrating a side view of an embodiment of a system including a component and semiconductor dies.

FIG. 6 is a block diagram illustrating a side view of an embodiment of a system 600 including a component 510-2 and semiconductor dies 110. In the system 600, semiconductor dies 110-9 and 110-10 do not include flaps 212 (FIG. 2). Instead, the component 510-2 is configured to bend (for example, based on one or more thicknesses, a non-uniform thickness and/or a length) in order to reduce or eliminate misalignment, such as the misalignment 312-3 (FIG. 4), as well planar misalignment of semiconductor dies 110-9 and 110-10.

While the self-alignment and self-adjusting in the third direction (Z) 118 (FIGS. 1A and 2) has been illustrated with passive components and structures, in other embodiments active components and/or structures may be used. For example, a closed feedback loop may measure a misalignment and drive an actuator, which reduces or eliminates the misalignment. The closed feedback loop may include an amplifier and an inverter arranged as a proportional-integral (PI) or a proportional-integral-differential (PID) controller.

Figure 7:
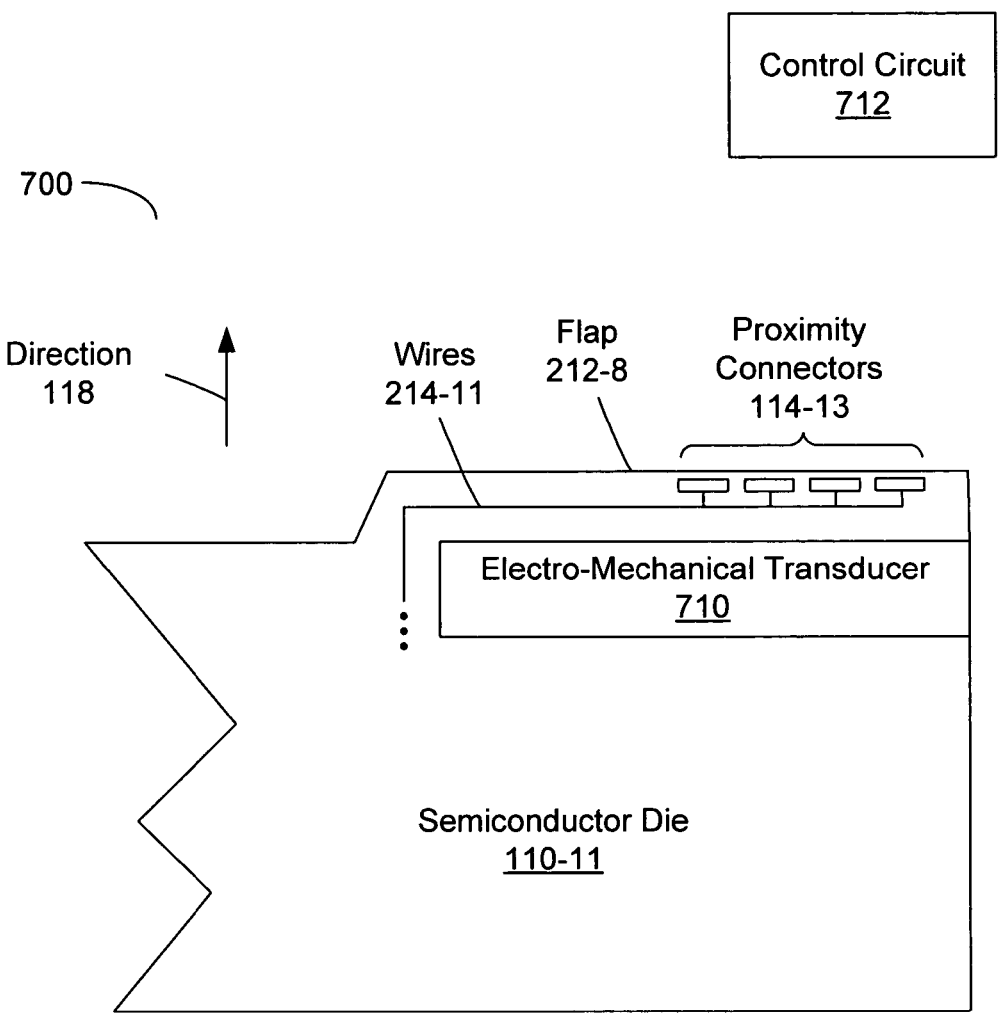
FIG. 7 is a block diagram illustrating a side view of an embodiment of a semiconductor die having an electro-mechanical transducer.
Figure 8A:
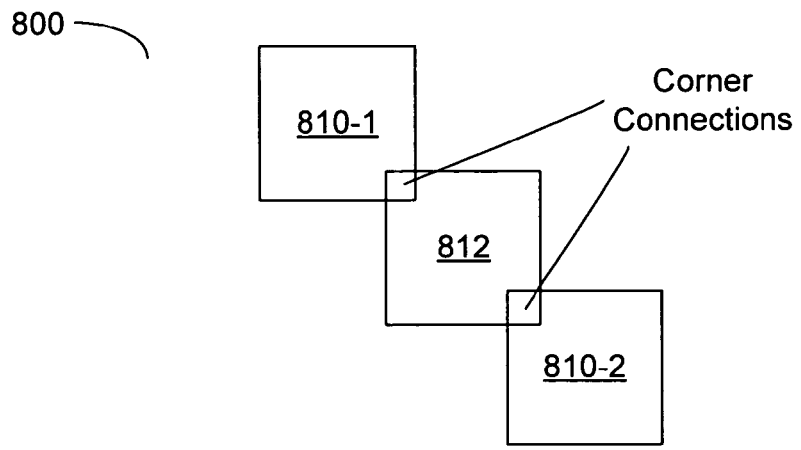
FIG. 8A is a block diagram illustrating a top view of an embodiment of a system including semiconductor dies and a component.
Figure 8B:
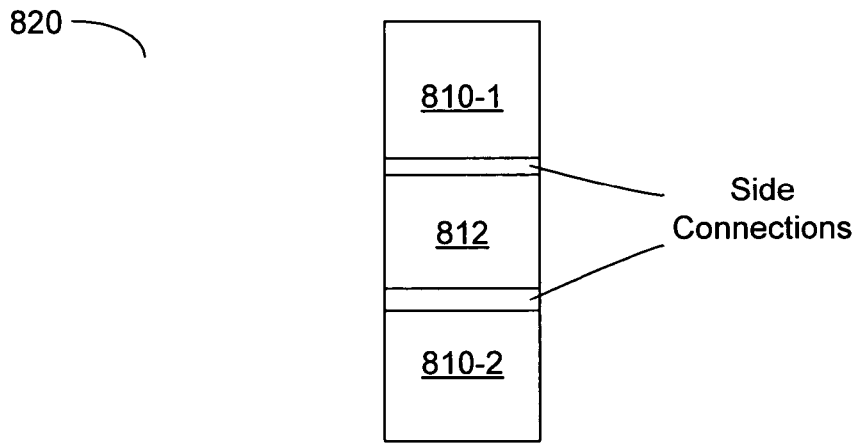
FIG. 8B is a block diagram illustrating a top view of an embodiment of a system including semiconductor dies and a component.
Figure 8C:
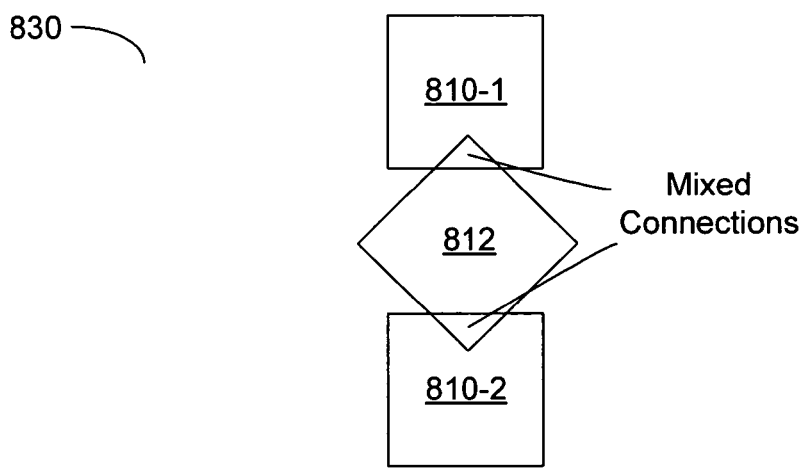
FIG. 8C is a block diagram illustrating a top view of an embodiment of a system including semiconductor dies and a component.
Figure 8D:
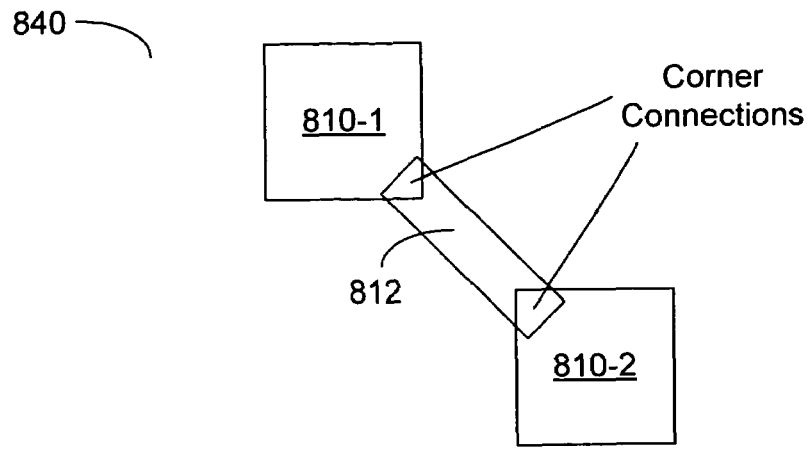
FIG. 8D is a block diagram illustrating a top view of an embodiment of a system including semiconductor dies and a component.
Figure 8E:
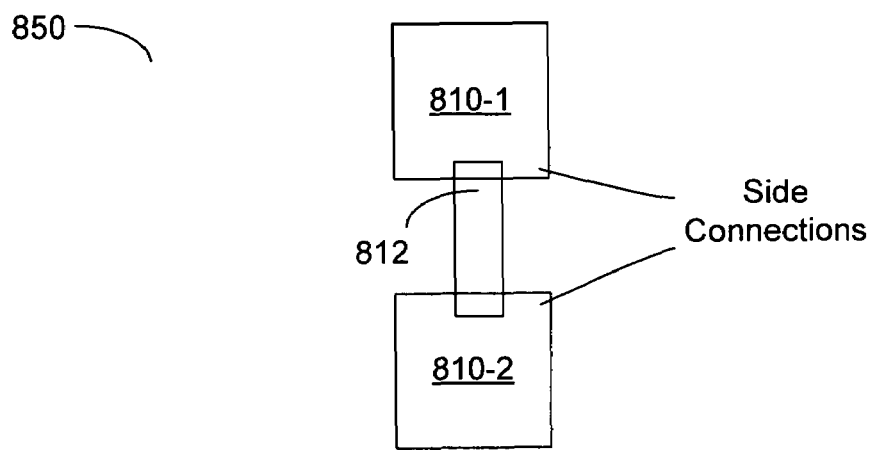
FIG. 8E is a block diagram illustrating a top view of an embodiment of a system including semiconductor dies and a component.
Figure 8F:
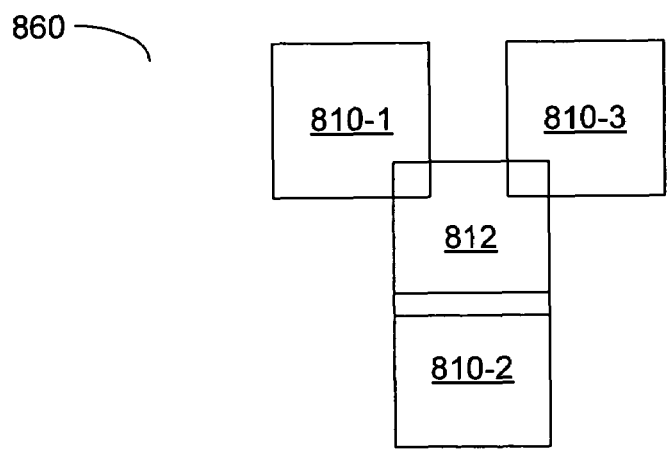
FIG. 8F is a block diagram illustrating a top view of an embodiment of a system including semiconductor dies and a component.
Figure 8G:
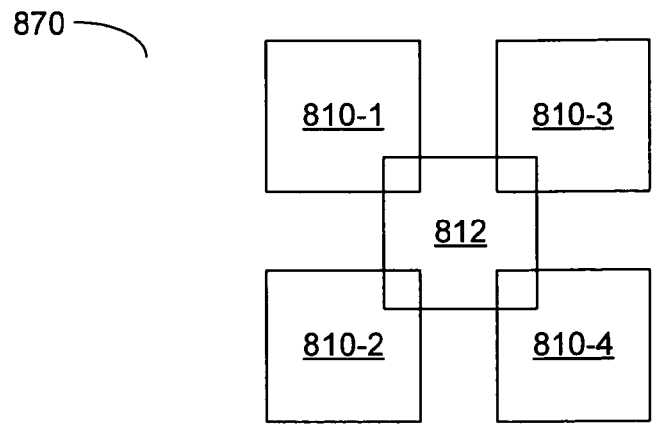
FIG. 8G is a block diagram illustrating a top view of an embodiment of a system including semiconductor dies and a component.
Figure 8H:
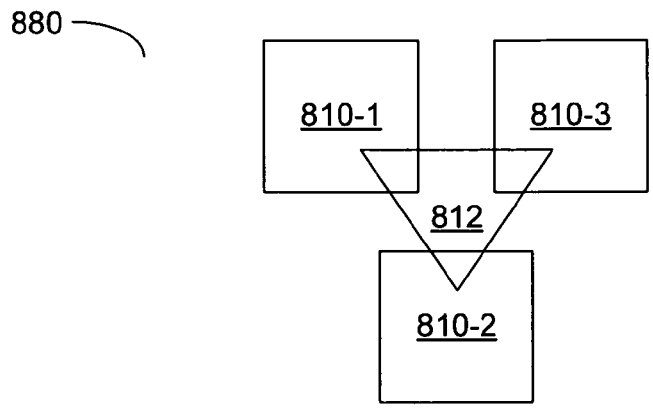
FIG. 8H is a block diagram illustrating a top view of an embodiment of a system including semiconductor dies and a component.
Figure 8I:
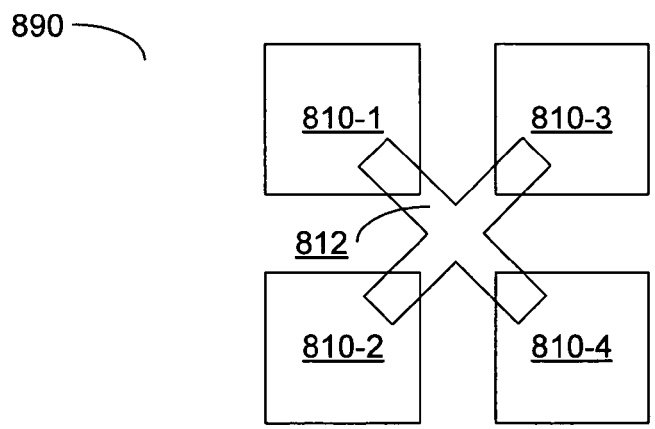
FIG. 8I is a block diagram illustrating a top view of an embodiment of a system including semiconductor dies and a component.

This approach is illustrated in FIG. 7, which is a block diagram showing a side view of an embodiment 700 of a semiconductor die 110-11 having at least one electromechanical transducer 710. The electromechanical transducer 710 provides a mating force. The electro-mechanical transducer 710 is closely coupled to a structure having a flexibility compliance, such as flap 212-8. An optional control circuit 712 may be included as part of a feedback loop based on a misalignment sensor (not shown).

The optional control circuit 712 may compare a measured misalignment, such as the misalignment 312-3 (FIG. 4), with a desired misalignment (i.e., a desired gap) between adjacent semiconductor dies. The optional control circuit 712 in the feedback loop may reduced and/or eliminate the misalignment even when there are considerable perturbations due to fabrication, assembly, operation and/or external causes, by providing control signals to the electromechanical transducer 710.

In some embodiments, the electro-mechanical transducer 710 is bonded to the semiconductor die 110-11. In other embodiments, the electro-mechanical transducer 710 is fabricated on the semiconductor die 110-11. In exemplary embodiments, the electro-mechanical transducer 710 is based on a piezo-electric effect, thermal expansion (such as a bi-metallic strip) or other effects as are known in the art.

It should be understood that embodiment 700 is illustrative of the components and functionality. Additional embodiments may include fewer or additional components, relative positions of two or more components may be changed, and two or more components may be combined into a single component. For example, functions of the optional control circuit 712 may be implemented in one or more components.

Referring back to FIG. 6, a wide variety of configurations may be used in systems, such as the system 600, that include one or more components, such as the component 510-2, bridging proximity connectors on two or more semiconductor dies 110. Several such embodiments are illustrated in FIGS. 8A-8I, which show top views of embodiments 800, 820, 830, 840, 850, 860, 870, 880 and 890 of systems including at least two semiconductor dies 810 and at least one component 812. The component 812 may have a variety of shapes and configurations. The component 812 may couple to proximity connectors on one or more sides and/or one or more corners of one or more of the semiconductor dies 810. The component 812 may have the same shape or a different shape than the semiconductor dies 810. In the embodiments 800, 820, 830, 840, 850, 860, 870, 880 and 890, the semiconductor dies 810 may be face up (with proximity connectors on or proximate to a top surface) and the component 812 may be face down (with proximity connectors on or proximate to a bottom surface). In some embodiments, the semiconductor dies 810 may be face down and the component 812 may be face up.

Figure 9:
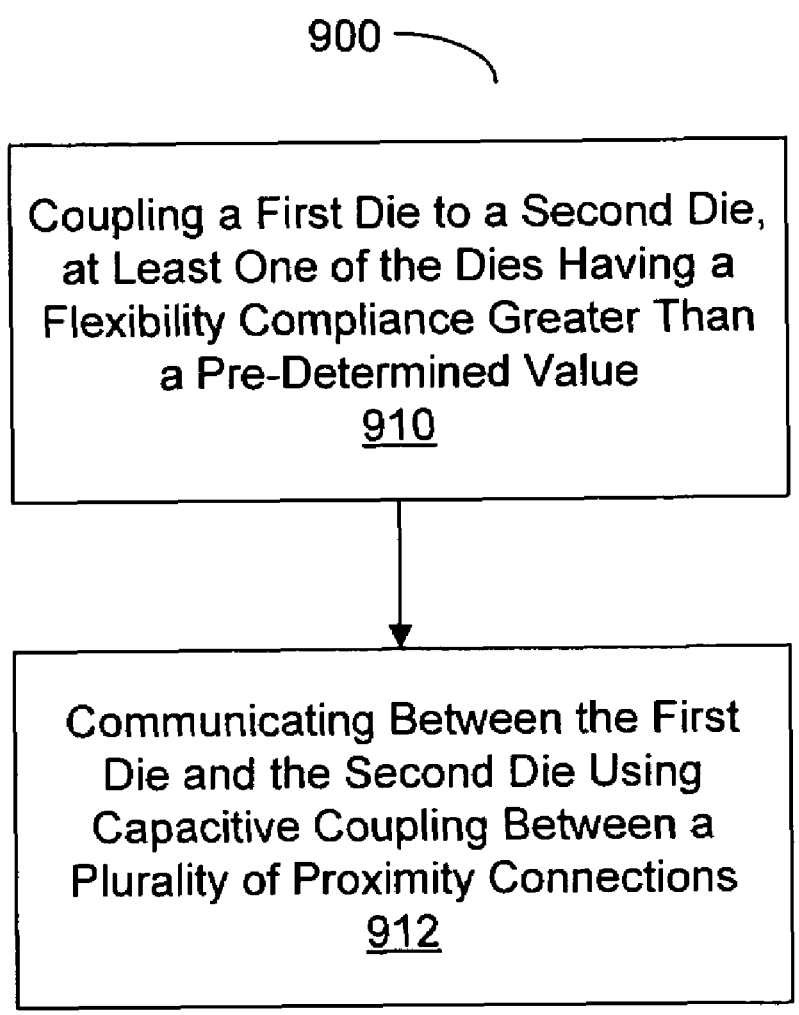
FIG. 9 is a flow chart illustrating an embodiment of a process for communicating signals between semiconductor dies using proximity connectors.

Attention is now directed towards FIG. 9, which illustrates a process 900 for communicating signals between semiconductor dies using proximity connectors. A first semiconductor die is coupled to a second semiconductor die (910). At least one of the semiconductor dies may have a flexibility compliance greater than the pre-determined value. Communication between the first semiconductor die and the second semiconductor die may use capacitive coupling between a plurality of proximity connections (912). In some embodiments, the process 900 may include fewer or additional operations, an order of the operations may be changed and/or two or more operations may be combined.

While several embodiments of structures for Z-aligned (i.e., in the third direction (Z) 118 in FIGS. 1A and 2) proximity communication have been described, in additional embodiments features in one or more of the embodiments may be combined. For example, a semiconductor die may have the thickness 116 (FIG. 1A), one or more flexural units, such as the flexural unit 210 (FIG. 2), and one or more electromechanical transducers, such as the electromechanical transducer 710 (FIG. 7).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A device, comprising:
a first semiconductor die having a first surface and a second surface; and
a flexural unit with a first end and a second end, wherein the first end of the flexural unit is coupled to the first surface, and the second end of the flexural unit includes a first proximity communication structure;
wherein the flexural unit is configured to be flexibly compliant;
wherein the first semiconductor die is configured to communicate with a second device using capacitive coupling between the first proximity communication structure and a second proximity communication structure in the second device; and
wherein the flexible compliance of the flexural unit allows the flexural unit to flex a pre-determined distance in a direction substantially perpendicular to a plane including the second proximity communication structure, thereby facilitating aligning the first proximity communication structure and the second proximity communication structure.

2. The device of claim 1, wherein the first semiconductor die has a thickness approximately less than a pre-determined value.

3. The device of claim 2, wherein the pre-determined value is 30 μm.

4. The system of claim 1, further comprising an electromechanical transducer coupled to the first surface.

5. The device of claim 1, wherein the flexural unit includes a plurality of flaps having a first end and second end, each flap coupled to the semiconductor die at the first end, and wherein each flap includes one or more proximity communication structures.

6. The device of claim 5,
wherein the flexural unit includes one or more proximity communication structures and interconnect wires connected to the one or more proximity communication structures;
wherein the one or more proximity communication structures and the interconnect wires are positioned above the first surface; and
wherein the one or more proximity communication structures and at least a portion of the interconnect wires are configured to displace substantially in the direction substantially perpendicular to the plane including the second proximity communication structure.

7. The device of claim 6, wherein the flexural unit further includes an electromechanical transducer coupled to the first surface of the semiconductor die and at least the portion of the interconnect wires, and wherein the electromechanical transducer is configured to displace the one or more proximity communication structures and at least the portion of the interconnect wires.

8. The system of claim 6, wherein the flexural unit facilitates precisely aligning the first proximity communication structure and the second proximity communication structure when they are misaligned by less than one half of a first pitch between two adjacent proximity communication structures in the flexural unit or less than one half of a second pitch between two adjacent proximity communication structures in the second device.

9. A system, comprising:
a first semiconductor die having:
a first surface and a second surface; and
a flexural unit with a first end and a second end, wherein the first end of the flexural unit is coupled to the first surface, and the second end of the flexural unit includes a first proximity communication structure; and a component having a third surface and a fourth surface, wherein the flexural unit is configured to be flexibly compliant;

wherein the first semiconductor die is configured to communicate with the component using capacitive coupling between the first proximity communication structure and a second proximity communication structure in the third surface;

wherein the flexible compliance of the flexural unit allows the flexural unit to flex a pre-determined distance in a direction substantially perpendicular to a plane including the second proximity communication structure, thereby facilitating aligning the first proximity communication structure and the second proximity communication structure.

10. The system of claim 9, further comprising a spacer positioned between the first surface of the first semiconductor die and the third surface of the component.

11. The system of claim 9, wherein the component is a second semiconductor die.

12. The system of claim 9, wherein the component has a thickness approximately less than a pre-determined value.

13. The system of claim 12, wherein the pre-determined value is 30 µm.

14. The system of claim 9, further comprising an electro-mechanical transducer coupled to the third surface.

15. The system of claim 9, wherein the flexural unit is configured to have a flexibility compliance greater than a pre-determined value in the direction in order to reduce misalignment in the direction between the first proximity communication structure and the second proximity communication structure.

16. The system of claim 9, further comprising a control circuit, wherein the control circuit provides feedback to reduce misalignment in the first direction between the first proximity communication structure and the second proximity communication structure.

17. The system of claim 9, wherein the flexural unit includes a plurality of flaps having a first end and second end, each flap coupled to the component at the first end, and wherein each flap includes one or more proximity communication structures.

18. The system of claim 17,
wherein the flexural unit includes one or more proximity communication structures and interconnect wires connected to the the one or more proximity communication structures; and wherein the one or more proximity communication structures and the interconnect wires are positioned above the third surface; and wherein the one or more proximity communication structures and at least a portion of the interconnect wires are configured to displace substantially in the direction substantially perpendicular to the plane including the second proximity communication structure.

19. The system of claim 18, the flexural unit further including an electro-mechanical transducer coupled to the third surface of the semiconductor die and to at least the portion of the interconnect wires, wherein the electro-mechanical transducer is configured to displace the one or more proximity communication structures and at least the portion of the interconnect wires.

20. The system of claim 18, wherein the flexural unit facilitates precisely aligning the first proximity communication structure and the second proximity communication structure when they are misaligned by less than one half of a first pitch between two adjacent proximity communication structures in the flexural unit or less than one half of a second pitch between two adjacent proximity communication structures in the component.

21. A system, comprising:
a first semiconductor die that includes:
a first surface and a second surface; and
a flexural unit with a first end and a second end, wherein the first end of the flexural unit is coupled to the first surface, and the second end of the flexural unit includes a first proximity communication structure; and a component that includes:
a third surface and a fourth surface;
a second flexural unit with a first end and a second end, wherein the first end of the second flexural unit is coupled to the third surface, and the second end of the flexural unit includes a second proximity communication structure;
a third proximity communication structure; and a second semiconductor die that includes:
a fifth surface and a sixth surface; and
a fourth proximity communication structure;

wherein the flexural unit and the second flexural unit are configured to be flexibly compliant;

wherein the first semiconductor die is configured to communicate with the component using capacitive coupling between the first proximity communication structure and the third proximity communication structure;

wherein the flexible compliance of the flexural unit allows the flexural unit to flex a first pre-determined distance in a direction substantially perpendicular to a plane including the third proximity communication structure, thereby facilitating aligning the first proximity communication structure and the third proximity communication structure;

wherein the component is configured to communicate with the second semiconductor die using capacitive coupling between the second proximity communication structure and the fourth proximity communication structure;

wherein the flexible compliance of the second flexural unit allows the second flexural unit to flex a second pre-determined distance in a direction substantially perpendicular to a plane including the fourth proximity communication structure, thereby facilitating aligning the second proximity communication structure and the fourth proximity communication structure; and wherein the component includes interconnect wires to couple the third proximity communication structure with the second proximity communication structure.

22. A device, comprising:
a first semiconductor die having a first surface and a second surface; and a flexural unit with a first end and a second end, wherein the first end of the flexural unit is coupled to the first surface, and the second end of the flexural unit includes a means for communication by capacitive coupling;

wherein the flexural unit is configured to be flexibly compliant;

wherein the first semiconductor die is configured to communicate with a second device using capacitive coupling between the means for communication by capacitive coupling and a second means for communication by capacitive coupling in the second device; and wherein the flexible compliance of the flexural unit allows the flexural unit to flex a pre-determined distance in a direction substantially perpendicular to the first surface in order to reduce misalignment in the direction between the means and the second means.

* * * * *

UNITED STATES PATENT AND TRADEMARK OFFICE
CERTIFICATE OF CORRECTION

PATENT NO. : 7,659,619 B1
APPLICATION NO. : 11/249821
DATED : February 9, 2010
INVENTOR(S) : Arthur R. Zingher et al.

Page 1 of 1

It is certified that error appears in the above-identified patent and that said Letters Patent is hereby corrected as shown below:

On the Title Page:

The first and sole Notice should read --

Subject to any disclaimer, the term of this patent is extended or adjusted under 35 U.S.C. 154(b) by 763 days.

On the title page of the patent item (56), (under the References Cited) column, please insert the following references:

| | | | |
|---|---|---|---|
| --2002/0004287 A1 | 01/2002 | Ravi, Dramadhati V. | 438/459 |
| 2003/0022603 A1 | 01/2003 | Tsao et al. | 451/57 |
| 2003/0032211 A1 | 02/2003 | Ladabaum, Igal | 438/42 |
| 2006/0087332 A1 | 04/2006 | Drost et al. | 324/754 |
| 2007/0023921 A1 | 02/2007 | Zingher et al. | 257/778 |
| 2007/0043894 A1 | 02/2007 | Zingher et al. | 710/310 |
| 6,500,696 B2 | 12/2002 | Sutherland, Ivan E. | 438/109 |
| 7,038,553 | 05/2006 | Garner et al. | 333/24-- |

Signed and Sealed this

Twenty-first Day of September, 2010

David J. Kappos
*Director of the United States Patent and Trademark Office*